United States Patent [19]

Fork et al.

[11] Patent Number: 5,733,641
[45] Date of Patent: Mar. 31, 1998

[54] BUFFERED SUBSTRATE FOR SEMICONDUCTOR DEVICES

[75] Inventors: David K. Fork, Palo Alto; James B. Boyce, Los Altos; Ping Mei, Palo Alto; Steve Ready, Santa Cruz; Richard I. Johnson, Menlo Park; Greg B. Anderson, Woodside, all of Calif.

[73] Assignee: Xerox Corporation, Stamford, Conn.

[21] Appl. No.: 656,460

[22] Filed: May 31, 1996

[51] Int. Cl.⁶ ........................................... B32B 15/00
[52] U.S. Cl. ........................... 428/210; 117/43; 117/45; 427/126.1; 427/126.2; 427/126.3; 428/156; 428/336; 428/428; 428/446; 428/469; 428/432; 428/472; 428/697; 428/701; 428/702; 437/24; 437/84; 437/228
[58] Field of Search ........................ 428/688, 209, 428/210, 701, 702, 446, 432, 428, 156, 697, 336, 469, 472; 437/228, 24, 84; 117/43, 45; 427/126.1, 126.2, 126.3

[56] References Cited

U.S. PATENT DOCUMENTS

| | | | |
|---|---|---|---|
| 4,333,792 | 6/1982 | Smith | 428/446 |
| 4,693,759 | 9/1987 | Noguchi | 437/24 |
| 4,906,594 | 3/1990 | Yoneda | 437/228 |
| 4,915,772 | 4/1990 | Fehlner | 117/43 |
| 5,037,774 | 8/1991 | Yamawaki | 437/84 |
| 5,061,655 | 10/1991 | Ipposhi | 117/45 |

OTHER PUBLICATIONS

James S. Im and H.J. Kim, "On the super lateral growth phenomenon observed in excimer laser–induced crystallization of thin Si films", *Appl. Phys. Lett.* 64(17), 25 Apr. 1994, pp. 2303–2305.

Hiroyuki Kuriyama et al., "Comprehensive Study of Lateral Grain Growth in Poly–Si Films by Excimer Laser Annealing and Its Application to Thin Film Transistors", *Jpn. J. Appl. Phys.*, vol. 33 (1994), pp. 5657–5662, Part 1, No. 10, Oct. 1994.

R.I. Johnson et al., "Critical Laser Fluence Observed in (111) Texture, Grain Size and Mobility of Laser Crystallized Amorphous Silicon", *Mat. Res. Soc. Symp. Proc.*, vol. 297, 1993, pp. 533–538.

CRC Handbook, 64th Ed. 1984, B–31 B–135.

*Primary Examiner*—Archene Turner
*Attorney, Agent, or Firm*—Oliff & Berridge, P.L.C.

[57] ABSTRACT

The invention provides a buffered substrate that includes a substrate, a buffer layer and a silicon layer. The buffer layer is disposed between the substrate and the silicon layer. The buffer layer has a melting point higher than a melting point of the substrate. A polycrystalline silicon layer is formed by crystallizing the silicon layer using a laser beam.

18 Claims, 2 Drawing Sheets

BUFFERED SUBSTRATE FOR SEMICONDUCTOR DEVICES

BACKGROUND OF THE INVENTION

1. Field of the Invention

This invention relates to a structure and method for forming polycrystalline layers having uniform and small polycrystalline grain sizes.

2. Description of Related Art

As feature sizes of such devices as thin film transistors (TFTs) decrease with increasing device densities for such products as displays and scanners, the sizes of polycrystalline silicon grains and grain size variations become increasingly important factors in polycrystalline silicon device characteristics. In particular, as TFT feature dimensions become smaller, smaller grains are required to obtain a statistically significant number of grains within channel regions of TFTs to assure uniform device characteristics for TFTs formed in the polycrystalline silicon layer. If grain sizes are large relative to TFT feature dimensions and grain size variation is also large, TFT characteristics may vary greatly depending on the number of grain boundaries that are included in the channel regions, for example.

Conventional techniques such as laser crystallization for forming polycrystalline silicon thin films produce polycrystalline layers having undesirably rough polycrystalline silicon film surfaces as well as large grains and grain size variations. In laser crystallization, an amorphous silicon layer is melted by a laser beam, and then the molten silicon is cooled to form a polycrystalline silicon layer. Laser crystallization using pulsed lasers having a 10% variation in laser fluence is common. However, such a variation can cause up to a 1,000% grain size variation in the polycrystalline silicon layer. Thus, the number of grains included in TFT structures manufactured by conventional pulsed laser crystallization varies greatly.

Conventional laser crystallization is practiced on silica, glass or silica buffered substrates. In these systems, the polycrystalline silicon grain size is strongly dependent on laser fluence. This phenomenon is explained by theories variously referred to as the critical laser fluence (see Johnson et al., Materials Research Society Symposium Proceedings vol. 297, page 533, 1993), lateral growth (see Kuriyama et al., Japanese Journal of Applied Physics Letters vol. 33, page 5657, 1994) and super lateral growth (see Im et al., Applied Physics Letters vol. 64, page 2303, 1994). Based on the above theories, silicon grains grow to large lateral dimensions (about 10 times the thickness of the silicon film) in a narrow range of laser fluence. This large lateral grain growth is often accompanied by large surface roughness.

When TFTs are formed in polycrystalline silicon film areas having large crystal grains, the grains are too large to provide a statistically significant number of grains for small TFT feature dimensions. In addition, the large crystal grains in a 100-nm-thick crystallized polycrystalline silicon layer can have a root-mean-square (rms) surface roughness value as large as about 60 nm. Such a large rms surface roughness value cannot support large device bias voltages due to insulator breakdowns.

To avoid the undesirable variations in grain sizes, techniques such as substrate heating are used to improve grain size uniformity in polycrystalline silicon layers. However, substrate heating introduces extra steps in the manufacturing process, thus increasing the process time required to manufacture devices, leading to higher product costs. In view of the above problems, techniques are needed for generating smaller and more uniform polycrystalline silicon grain sizes without increasing manufacturing process time and product costs.

SUMMARY OF THE INVENTION

The invention provides a buffered substrate that includes a substrate, a buffer layer formed over the substrate and a silicon layer formed over the buffer layer. The buffer layer has a melting point higher than a threshold temperature of the substrate. After the silicon layer is formed over the buffer layer, it is crystallized using a laser beam.

The substrate includes materials such as $SiO_2$, glass, quartz and metal. The buffer layer includes materials such as $MgO$, $MgAl_2O_4$, $Al_2O_3$ and $ZrO_2$. The silicon layer may be an amorphous silicon layer and may have a thickness of about 100 nm.

A method for forming the buffer substrate includes forming a buffer layer over a substrate. A silicon layer is formed over the buffer layer, and then the silicon layer is crystallized using a laser beam.

BRIEF DESCRIPTION OF THE DRAWINGS

The invention is described in detail with reference to the following drawings, wherein like numerals represent like elements:

FIGS. 2A–2E show a process of a preferred embodiment.

DETAILED DESCRIPTION OF PREFERRED EMBODIMENTS

Figure 1:
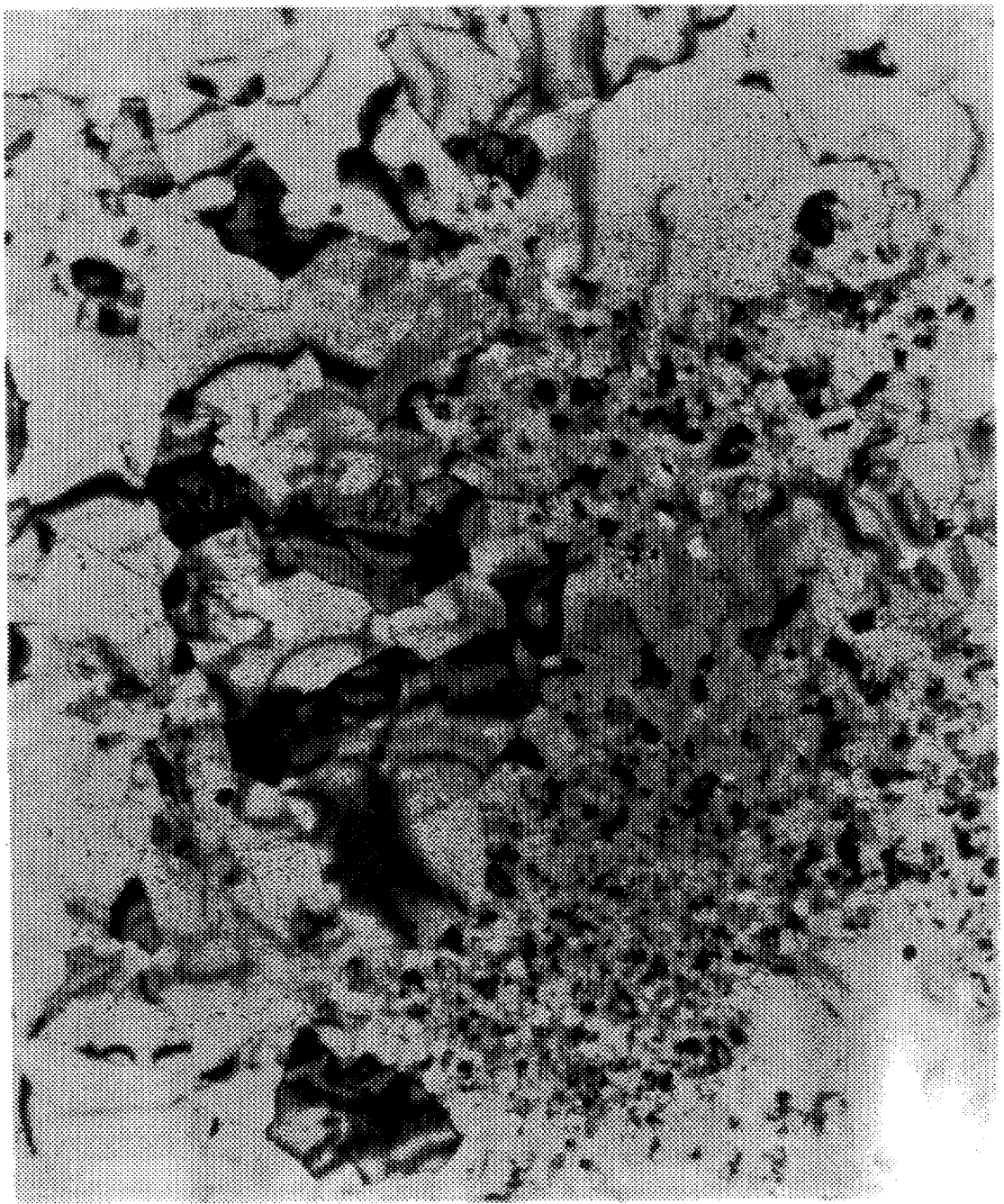
FIG. 1 is a planar view of a Transmission-Electron-Microscopy (TEM) micrograph of a polycrystalline silicon layer having isotropic and lateral grain growths.

In laser crystallization processes, the primary cause of large grain size variations is the absence of heterogeneous nucleation by the substrate/liquid-silicon interface. This lack of heterogeneous nucleation results in polycrystalline silicon grains growing to large lateral dimensions (about 10 times the thickness of the silicon film) in a narrow range of laser fluence. This large lateral grain growth is often accompanied by large surface roughness.

In addition, the silicon crystallization process is extremely sensitive to the fluence of the laser used to melt the silicon. This sensitivity to laser fluence is a large factor causing grain size variations and stems from a difference in nucleation density between silicon crystallizing when in contact with unmelted silicon and silicon crystallizing when in contact with an underlying substrate. When the laser fluence is intense enough to "melt-through" portions of the silicon layer, the melted silicon that contacts the substrate has a different nucleation density from other portions of melted silicon not in contact with the substrate. If the laser fluence is set above a threshold necessary to melt-through all of the silicon layer in an attempt to achieve uniform nucleation density, the substrate is often damaged and causes undesirable effects, such as ablation of the polycrystalline silicon layer.

A preferred embodiment of this invention reduces polycrystalline silicon grain sizes and grain size variations by providing a buffer layer between the substrate and the silicon layer. The buffer layer is formed from materials that can withstand a temperature higher than a threshold temperature of the substrate. If a substrate is heated above its threshold temperature, undesirable effects occur, such as melting the substrate or ablation of films formed over the substrate.

Thus, the buffer layer shields the substrate from the above undesirable effects. For example, $SiO_2$ substrates have a melting point between about 1610°–1723° C. Thus, materials having melting points higher than 1723° C. may be used as a buffer layer for $SiO_2$ substrates.

In addition to being able to withstand a temperature higher than the threshold temperature of a substrate, the buffer layer also provides for higher silicon nucleation density. When sufficient nuclei exist at the substrate-molten silicon interface, crystallization proceeds to form grains with dimensions approximately equal to that of the thickness of the polycrystalline silicon film. This phenomenon is called isotropic grain growth. The buffer layer promotes isotropic silicon grain growth. The increase of isotropic grain growth avoids large lateral grain growth and reduces lateral grain dimensions to about the thickness of the polycrystalline silicon film.

When molten silicon that contacts the buffer layer is cooled, the increased nucleation density results in smaller silicon grains and greater uniformity in silicon grain sizes. A large number of smaller silicon grains results in a statistically significant number of grains relative to the dimensions of the devices that are formed. The larger number of grains per device leads to more uniform device characteristics and thus more reliable products made from such devices.

A non-exhaustive list of possible materials that meet these requirements for $SiO_2$ substrates is shown in the TABLE below.

TABLE

| Material | Melting Point °C. |
| --- | --- |
| MgO | 2852 |
| $MgAl_2O_4$ | >2200 |
| $Al_2O_3$ | 2980 |
| $ZrO_2$ | 2700 |

Because these materials have higher melting points than a $SiO_2$ substrate, a buffer layer formed using these materials provides higher resistance to substrate damage caused by laser irradiation.

Limiting substrate damage is particularly important for devices such as bottom gate TFTs. Because the gate electrode is formed on the substrate below active layers of such TFTs, current leakage may occur due to substrate damage. If the gate electrode is formed between the substrate and the buffer layer, the buffer layer thermally protects the substrate while serving as the gate insulator layer of the bottom gate TFT. Thus, the buffer layer improves device performance.

When it is desirable to increase the thermal resistance of the buffer layer, multilayers of high melting point materials may be used. Thus, the buffer layer may be formed of a single layer or of multiple layers depending on the thermal boundary requirements. It may also be advantageous to protect the substrate from thermal damage by extending the amount of time for the melting process or other similar methods.

A polycrystalline silicon layer crystallized by a combination of isotropic and lateral grain growths has regions of low (about unity) and high aspect ratio grains, where the aspect ratio of a grain is a ratio between a width and a height of the grain. FIG. 1 shows a TEM micrograph of a sample of such a polycrystalline silicon layer. The grain size variation of polycrystalline silicon films having both isotropic and lateral grain growths is approximately the difference in grain sizes between laterally crystallized grains and isotropically crystallized grains. For example, lateral growth in 100 nm thick silicon films often results in 1 μm grains situated in a matrix of isotropically crystallized grains about 100 nm in size. Thus, the grain size variation is about 10 times.

In contrast, the preferred embodiment provides a polycrystalline silicon layer having a grain size variation of less than or equal to about two (2) and an average grain size of less than or equal to about the thickness of the polycrystalline silicon layer.

FIGS. 2A–2E show a process for forming a polycrystalline silicon layer having small and uniform grain sizes. FIG. 2A shows a substrate 100 formed from materials such as quartz or glass, for example, $SiO_2$, Corning 7059 or 1731 (Corning 7059 or 1731 are common substrate materials easily obtained from Corning Glass Works, Corning, N.Y. 14830). The substrate 100 may also include other structures, such as bottom gate dielectric and gate electrodes for bottom gate devices, for example.

FIG. 2B shows a buffer layer 102 formed over the substrate 100. The buffer layer 102 may be formed over the substrate 100 by techniques such as physical vapor deposition (i.e. electron beam, sputtering, thermal evaporation, pulsed laser deposition, etc.), chemical vapor deposition (CVD) or solgel processing. Only a thin buffer layer 102 is required, and, in some cases, complete coverage of the surface of the substrate 100 is not necessary. If the buffer layer 102 only partially covers the surface of the substrate 100 and forms islands, an island density should be equal to about the grain density desired for the polycrystalline silicon layer.

In FIG. 2C, an amorphous silicon layer 104 is formed over the buffer layer 102 having a thickness of less than or equal to about 100 nm. Other thicknesses may be used. Amorphous silicon layers with thicknesses of less than or equal to about 100 nm are preferred for pulsed laser crystallization processes because of device related issues. Also, the silicon layer need not be amorphous since the laser beam melts the silicon layer and removes any prior crystalline structure.

The amorphous silicon layer is melted by using a laser beam 106 and then cooled to crystallize the silicon, forming a polycrystalline layer 108 as shown in FIGS. 2D and 2E, respectively. The laser beam 106 may be generated by lasers such as a YAG laser or an excimer laser. An excimer laser is often preferred because of the greater process speed due to the wide area of illumination provided by the excimer laser.

Experimental measurements of polycrystalline silicon layers of approximately 100 nm thick formed by conventional laser crystallization indicate that lateral grain growth occurs in a narrow laser fluence range of about 540±20 $mJ/cm^2$ or about 10% of the total possible laser fluence range. This narrow range of laser fluence lies in approximately the center of the laser fluence range required to perform laser crystallization. Thus, to avoid large grain sizes, the laser fluence must be restricted from fluctuating into the narrow laser fluence range. However, because the laser fluence of industrial lasers used for manufacturing devices is difficult to control, the laser fluence output by the industrial lasers must avoid the lateral growth laser fluence range. Thus, the range of laser fluence of industrial lasers available for crystallization is very restricted.

In contrast, the industrial laser fluence control requirements are relaxed when a buffer layer is used. Lateral grain growth is inhibited by the silicon grain nucleation initiated by the buffer layer. In principle, the entire range of laser fluence from melt-through (about 300 $mJ/cm^2$) to ablation (about 600 $mJ/cm^2$) for 100 nm thick silicon films is available when a buffer layer is present. Thus, with a buffer layer, a much larger laser fluence range is available.

The process shown in FIGS. 2A–2E forms a polycrystalline silicon layer 108 having an average grain size variation of less than or equal to about two (2), as compared to a grain size variation of 10 for conventional techniques. Thus, the buffer layer 102 reduces grain size variations by at least a factor of five (5).

The uniformity of the grain sizes of the polycrystalline layer 108 is also greatly improved, resulting in greater uniformity of device characteristics formed in the polycrystalline layer 108. Devices such as TFTs, capacitors and resistors are more reliable, leading to superior products.

Further, for polycrystalline silicon layers having a thickness of about 100 nm, an rms surface roughness value of the polycrystalline silicon layer 108 is about 6 nm or less. This is an order of magnitude improvement over the rms surface roughness value of 60 nm produced by conventional laser crystallization techniques in the lateral growth regime.

While this invention has been described in conjunction with specific embodiments thereof, it is evident that many alternatives, modifications and variations will be apparent to those skilled in the art. For example, the same principles would apply to pulsed laser crystallization of microcrystalline Si, Ge or SiGe alloys. Accordingly, preferred embodiments of the invention as set forth herein are intended to be illustrative, not limiting. Various changes may be made without departing from the spirit and scope of the invention as defined in the following claims.

What is claimed is:

1. A buffered substrate formed by using a laser beam, comprising:

a substrate including at least one of silicon dioxide, glass, quartz and metal;

a buffer layer formed over the substrate, the buffer layer having a melting point higher than a threshold temperature of the substrate; and a silicon layer formed over the buffer layer, wherein the silicon layer is crystallized using a laser beam after being formed over the buffer layer, the buffer layer including uniform silicon crystal grains having a grain size variation of less than or equal to a factor of about 2, and determining a nucleation density of the silicon layer.

2. The buffered substrate of claim 1, wherein the buffer layer forms islands over the substrate.

3. The buffered substrate of claim 1, wherein the buffer layer comprises at least one of MgO, $MgAl_2O_4$, $Al_2O_3$ and $ZrO_2$.

4. The buffered substrate of claim 1, wherein the laser beam is one of an excimer laser beam and a YAG laser beam.

5. The buffered substrate of claim 1, wherein the silicon layer is an amorphous silicon layer before the silicon layer is crystallized.

6. The buffered substrate of claim 5, wherein a thickness of the amorphous silicon layer is less than or equal to about 100 nm.

7. The buffered substrate of claim 6, wherein a laser fluence range is between about 300 to 600 $mJ/cm^2$.

8. The buffered substrate of claim 5, wherein the amorphous silicon layer is crystallized to form a polycrystalline silicon layer.

9. The buffered substrate of claim 8, wherein an average grain size of the polycrystalline silicon layer is less than about a thickness of the polycrystalline silicon layer.

10. The buffered substrate of claim 8, wherein a root-mean-square roughness of the polycrystalline silicon layer is less than or equal to about 6 nm.

11. A method for forming a buffered substrate using a laser beam, comprising:

forming a buffer layer over a substrate, the substrate including at least one of silicon dioxide, glass, quartz and metal, the buffer layer having a melting point higher than a threshold temperature of the substrate;

forming a silicon layer over the buffer layer; and then crystallizing the silicon layer using a laser beam, wherein the buffer layer includes uniform silicon crystal grains having a grain size variation of less than or equal to a factor of about 2, and determines a nucleation density of the silicon layer.

12. The method of claim 11, wherein the buffer layer forms islands over the substrate.

13. The method of claim 11, wherein the buffer layer comprises at least one of MgO, $MgAl_2O_4$, $Al_2O_3$ and $ZrO_2$.

14. The method of claim 11, wherein the silicon layer is an amorphous layer before the silicon layer is crystallized.

15. The method of claim 14, wherein a thickness of the amorphous silicon layer is less than or equal to about 100 nm.

16. The method of claim 14, further comprising crystallizing the amorphous silicon layer to form a polycrystalline silicon layer.

17. The method of claim 16, wherein an average grain size of the polycrystalline silicon layer is less than about a thickness of the polycrystalline silicon layer.

18. The method of claim 16, wherein a root-mean-square roughness of the polycrystalline silicon layer is less than or equal to about 6 nm.

* * * * *